United States Patent
Bull et al.

(10) Patent No.: US 6,785,179 B1
(45) Date of Patent: Aug. 31, 2004

(54) CHARGE SHARING BETWEEN BIT LINES WITHIN A MEMORY CIRCUIT TO INCREASE RECHARGE SPEED

(75) Inventors: David Michael Bull, Balsham (GB); Paul Darren Hoxey, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 10/464,848

(22) Filed: Jun. 19, 2003

(51) Int. Cl.$^7$ ................................................ G11C 7/00
(52) U.S. Cl. .................. 365/203; 365/149; 365/154; 365/190
(58) Field of Search ........................... 365/149, 154, 365/156, 190, 203

(56) References Cited

U.S. PATENT DOCUMENTS

| | | | |
|---|---|---|---|
| 6,574,128 B1 * | 6/2003 | Morgan | 365/72 |
| 6,608,788 B2 * | 8/2003 | Ma et al. | 365/203 |
| 6,711,067 B1 * | 3/2004 | Kablanian | 365/189.02 |
| 2003/0058720 A1 * | 3/2003 | Park | 365/203 |

* cited by examiner

Primary Examiner—Son Mai
(74) Attorney, Agent, or Firm—Nixon & Vanderhye P.C.

(57) ABSTRACT

A memory circuit 2 includes a plurality of memory cells 4, 6 which are subject to memory access operations. These memory access operations serve to selectively discharge one or more of the bit lines A, Abar, B, Bbar associated with the memory cells 4, 6. During a subsequent precharge operation serving to restore the precharged voltage levels of the bit lines A, Abar, B Bbar charge sharing is performed between non-accessed bit lines and those which have been accessed and accordingly at least partially discharged. Also the precharging circuits 12, 14, 16, 18 associated with the non-accessed bit lines contribute towards the precharging operation.

14 Claims, 5 Drawing Sheets

| | G1 | G2 | G3 | G4 |
|---|---|---|---|---|
| read/write A | open | shut | open | shut |
| read/write B | shut | open | shut | open |

CHARGE SHARING BETWEEN BIT LINES WITHIN A MEMORY CIRCUIT TO INCREASE RECHARGE SPEED

BACKGROUND OF THE INVENTION

1. Field of the Invention

This invention relates to the field of memory circuits. More particularly, this invention relates to memory circuits using bit lines precharged to a precharged state prior to a memory access operation to a memory cell via one or more respective precharged bit line.

2. Description of the Prior Art

It is known to provide memory circuits, such as RAM circuits, cache memory circuits and the like, which utilize arrays of memory cells arranged in rows and columns. Pairs of bit lines pass between respective memory cells within a column of memory cells. A row select signal is used subsequent to an address decoding to select a row of memory cells within the array to be coupled to their respective bit line pairs. (It may be that only a subset of the memory cells within a row are actually read in a given operation, e.g. a particular word within a multi-word row may be required for access). Depending upon the data value stored within a memory cell the bit line pair coupled to that memory cell when the memory cell is being read will have one of its bit lines discharged from a precharged state down towards the ground voltage. A sense amplifier coupled to the bit lines being read will sense a low voltage level from a partial discharged one of the two bit lines of the bit line pair and determine from this whether a 0 or a 1 was stored in the memory cell. The bit line being discharged will typically not be completely discharged since the sense amplifier will detect the difference in voltage when it is only partially discharged.

Subsequent to the read operation, the discharged bit lines need to be precharged back up to their precharged state. A precharge circuit operable subsequent to the read serves to return the partially discharged bit lines back to the precharged state.

It will be appreciated that when an entire row of memory cells is selected by the address decoder, all of these will be coupled to their respective bit line pairs and cause their own bit line discharge to occur. It may be that only some of these memory cells actually require to be read, e.g. only a single word or word pair is being read from a multiple word memory row. Nevertheless, all of the bit lines for that memory row need to be precharged back up to the precharged state.

During a write operation to a memory cell, the bit line pair is used with one of the bit lines being driven high and the other being driven low so as to force a particular data value to be stored within a memory cell coupled to that bit line by a current row select signal. Contrasting with a read operation, a write operation does typically force one of the bit lines of a bit line pair fully down to a ground voltage level with the other at the full rail voltage so as to overcome the "stickiness" of the memory cell being written to. A result of this is that the fully discharged bit line which has been grounded needs to be recharged all the way back to its precharge level. Thus, the pre-charging subsequent to a write operation can consume a disadvantageous amount of time.

It will be appreciated that memory performance either or both in terms of memory access speed and memory cycle time is a critical performance parameter within data processing systems. Measures which can increase such memory performance are strongly advantageous. The time within the memory cycle needed to precharge the bit lines following a memory access operation represents a significant proportion of the total memory cycle time and accordingly measures which can speed the pre-charging are advantageous. The time taken to turn off the bit line prechargers can also influence the memory access time if this time to turn off the prechargers is longer than the time taken to assert a row line during a parallel row decoding operation.

One approach to speeding pre-charging is to utilize pre-charging circuits containing stronger transistors capable of delivering more pre-charging current and so raising the bit lines to the precharged state more quickly. However, a disadvantage of this approach is that such stronger pre-charging circuits will tend to consume a disadvantageous amount of circuit area and may not be pitch matched to the other circuit elements within the memory. Furthermore, the control of such stronger pre-charging circuits will tend to be slower negating at least some of the speed advantage associated with the stronger pre-charging circuits and will also consume more power.

SUMMARY OF THE INVENTION

Viewed from one aspect the present invention provides a memory circuit comprising:

a plurality of memory cells operable to store respective data values;

a plurality of bit lines coupled to said plurality of memory cells and operable such that when a target memory cell is subject to a memory access operation a target bit line coupled to said target memory cell is driven away from a precharged state;

a precharge circuit operable to perform a precharge operation to precharge said plurality of bit lines to said precharged state prior to said memory access operation; and a charge sharing circuit operable following said memory access to couple bit lines of one or more memory cells not subject to said memory access operation to said target bit line that was driven away from said precharged state to share charge with is said target bit line to augment said precharge circuit in returning said target bit line to said precharged state.

The invention recognizes that within a memory circuit undergoing a memory access operation some of the bit lines will not be used in that memory access operation and the hold a significant amount of charge and have associated pre-charging circuits. Accordingly, the precharging operation can be advantageously speeded by sharing charge between bit lines which have not been subject to the memory access operation and those which have been driven away from the precharged state. The capacitance of the unused bit lines acts as a charge store which is then shared with the partially discharged bit lines which have been subject to a memory access. The precharging circuits associated with the bit lines which are sharing their charge can also then all act together to restore the precharged state more rapidly. This allows an advantageous decrease in memory cycle time.

In preferred embodiments of the invention the charge sharing circuit comprises one or more switching circuits operable during said memory access operation to selectively couple said target bit line to an output of said memory circuit and operable during said precharge operation to couple said target bit line to said bit lines of one or more memory cells not subject to said memory access operation.

In accordance with the above feature circuit elements which are already included within the memory circuit for normal memory access to select a the particular bit line pair to be connected to the memory output can be reused for the charge sharing operation by controlling them in a different way such that bit lines which are to share charge are coupled together. This reduces the circuit overhead associated with the charge sharing technique.

It will be appreciated that one form of memory access operation which may utilize the current technique is a write operation in which the target bit line is driven away from the precharged state by a write driver circuit so as to force a data value into the target memory cell. As previously mentioned, write operations tend to require a greater degree of precharging subsequent to those operations and accordingly can contribute significantly to the limiting case which must be dealt with within the memory cycle time.

Another possibility is that the memory access operation is a read operation in which the target bit line is driven away from the precharged state in dependence upon the data value stored within the target memory cell. Whilst during a read operation the bit lines are discharged less deeply, the present technique is still highly useful in that a large number of read operations take place and in many of these an entire memory row will have been at least partially discharged and require precharging even though only a portion of the memory cells within that memory row are required for the read.

In particularly preferred embodiments of the invention the memory is arranged into two or more memory banks such that whilst one memory bank is being accessed at least one other memory bank is not being accessed. Thus, the non-access memory bank will not be subject to any discharge of its bit lines and so may charge share with the bit lines of the accessed memory bank so as to speed up the precharge operation.

Whilst it is not essential to the general aspect of the invention that the memory should be arranged in rows and columns, the invention is well suited to such arrangements as the bit line charge sharing may be advantageously readily provided within such regular architectures.

It will be appreciated that the invention is applicable to a wide type of different memories and is not limited to RAM memories, cache memories or any other type of memory. The technique is also not limited to any polarity of charging and discharging or any particular charge level in the precharged state.

Viewed from another aspect the present invention provides a method of to operating a memory circuit, said method comprising the steps of:

storing data values within respective ones of a plurality of memory cells, said plurality of memory cells being coupled to a plurality of bit lines;

when a target memory cell is subject to a memory access operation, driving a target bit line coupled to said target memory cell away from a precharged state;

performing a precharge operation to precharge said plurality of bit lines to said precharged state prior to said memory access operation; and following said memory access, coupling bit lines of one or more memory cells not subject to said memory access operation to said target bit line that was driven away from said precharged state to share charge with said target bit line to assist in said precharge operation returning said target bit line to said precharged state.

The above, and other objects, features and advantages of this invention will be apparent from the following detailed description of illustrative embodiments which is to be read in connection with the accompanying drawings.

BRIEF DESCRIPTION OF THE DRAWINGS

FIG. 1 schematically illustrates a memory circuit utilising precharged bit lines;

FIGS. 2 and 3 are tables showing the control of gates within the circuit of FIG. 1 during read and write operations and the target charged levels within a write operation;

DESCRIPTION OF THE PREFERRED EMBODIMENTS

Figures 1, 2:
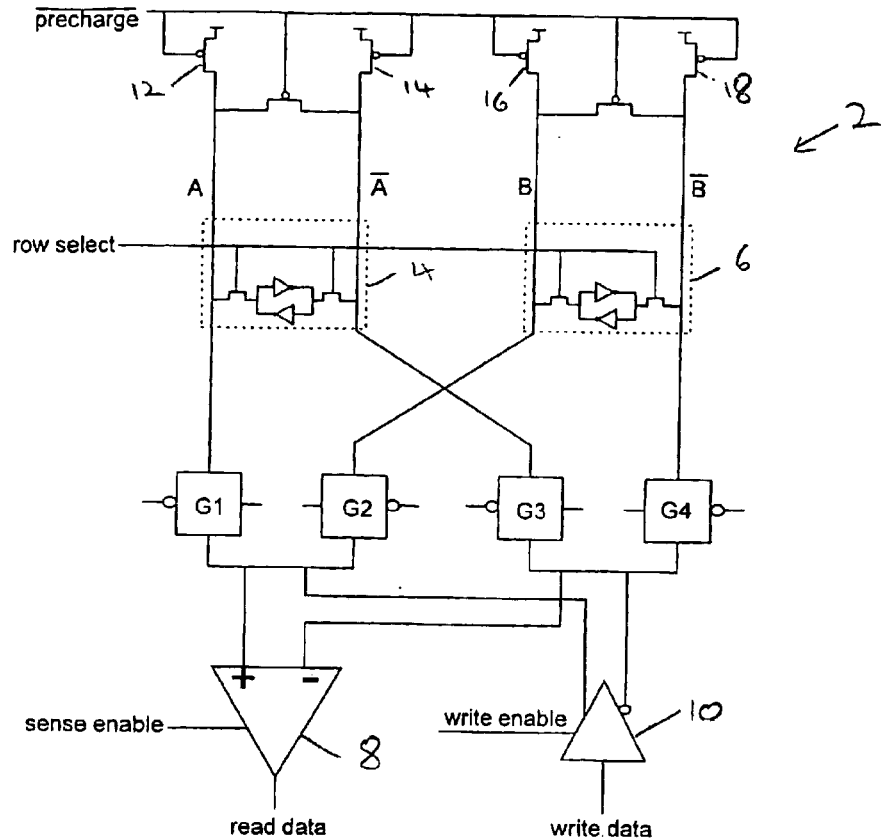

FIG. 1 schematically illustrates a memory circuit 2 comprising memory cells 4, 6 with respective bit lines A, Abar, B, Bbar. Transmission gates G1, G2, G3 and G4 couple the bit lines A, Abar, B, Bbar to either a sense amplifier 8 or a write driver 10.

A precharge signal operates during a precharge cycle to switch on precharge transistors 12, 14, 16, 18 which drive the bit lines A, Abar, B, Bbar to a precharged voltage level (high, Vdd).

FIG. 2 is a table showing the state of the transmission gates G1, G2, G3, G4 during memory access (read or write) operations to the respective memory cells 4, 6. When memory cell 4 is being accessed, the gates G1 and G3 are open and the gates G2 and G4 are shut. Conversely, when memory cell 6 is being accessed, gates G2 and G4 are open and gates G1 and G3 are shut.

FIG. 3 is a table illustrating the action taken in respect of each of the bit lines A, Abar, B, Bbar of the circuit of FIG. 1 during a write operation. The write operation illustrated is a write to memory cell 4 of a bit which is stored such that when the bit concerned is read the bit line A will be taken low by the memory cell 4. More particularly, during the write operation the bit lines B and Bbar are left precharged high with the bit line A being drive low via gate G1 by the write driver 10 whilst the bit line Abar is driven high via gate G3 by the write driver 10.

Figure 4:
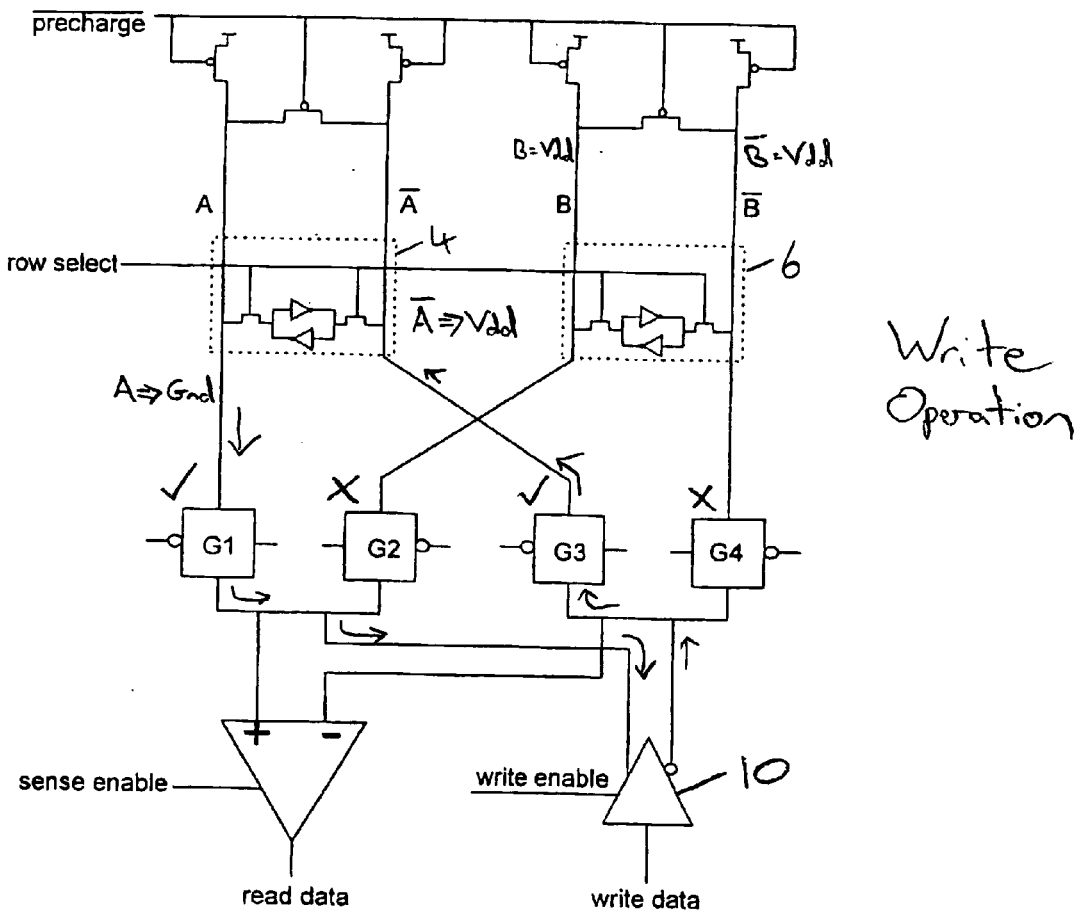
FIG. 4 schematically illustrates the circuit of FIG. 1 during a write operation.

FIG. 4 illustrates the write operation discussed above in more detail. In particular, the bit lines B and Bbar associated within the memory cell 6 are left unaltered with their respective gates G2 and G4 being switched shut. The gates G1 and G3, respectively coupled to the bit lines A and Abar are open and the write driver 10 serves to force the bit line A to ground and the bit line Abar to the high voltage Vdd. As illustrated, this involves charge flowing from the bit line A through the gate G1 and the write driver 10 to ground so as to force the potential of the bit line A to ground. Conversely, charge flows from the write driver 10 through the gate G3 into the bit line Abar to force the potential of the bit line Abar high. As is conventional the difference in potential between the bit line A and the bit line Abar serves to force the memory cell 4 to adopt a desired state overcoming its relatively weak internal feedback so as to store the new bit value being impressed upon that memory cell 4 by the applied bit line voltages.

Figure 5:
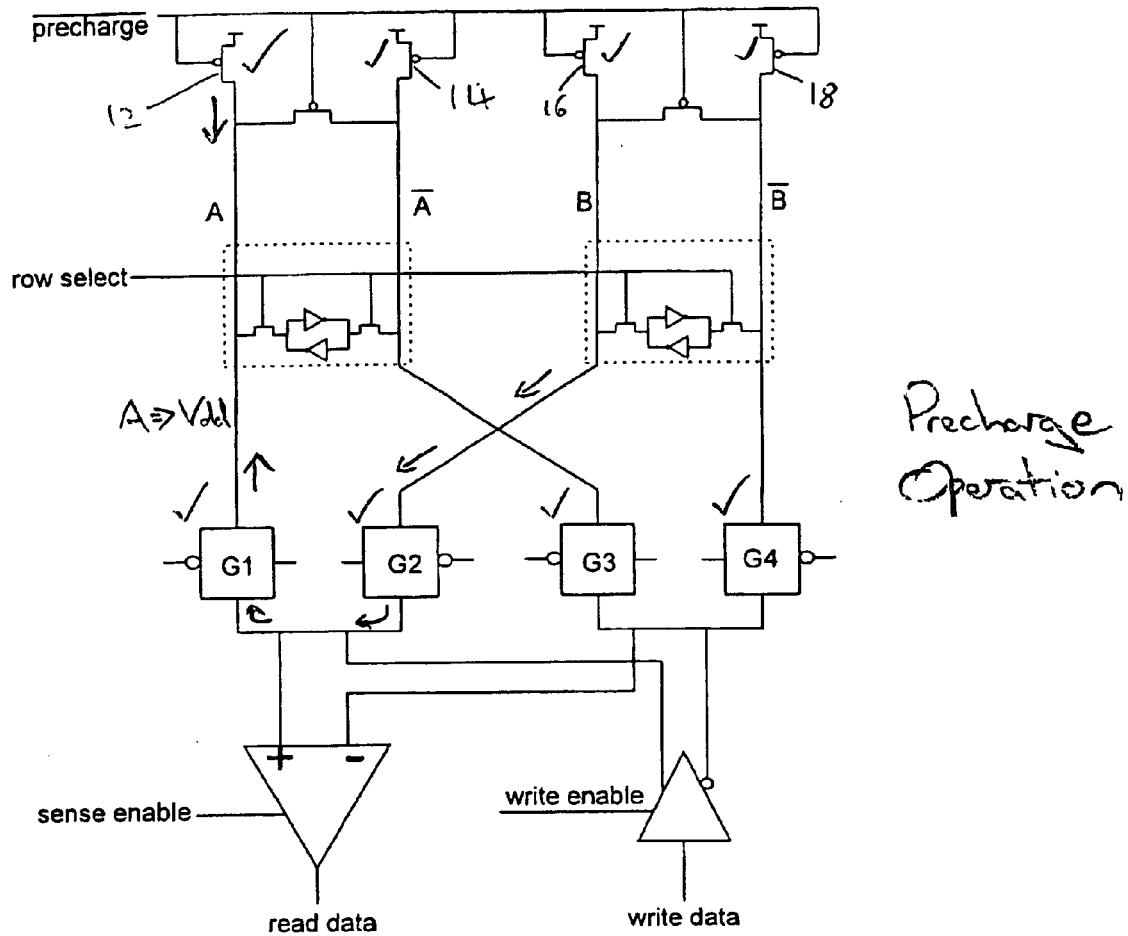
FIG. 5 schematically illustrates the circuit of FIG. 1 during a precharge operation.

Subsequent to the write operation illustrated in FIG. 4, the bit line A will be at a ground potential, or nearly so, and will require driving back up to a high potential to reach the precharged state ready for subsequent memory access operations. FIG. 5 illustrates the present technique whereby the charge already stored upon the bit line B is shared with the bit line A during this precharge operation. This is achieved by opening gate G2 and gate G1 during the precharge operation to allow a charge path from the bit line B to the bit line A. It will be appreciated that the precharge transistors 12 and 16 both serve to contribute towards the precharging of the bit line A. Conversely, without the charge sharing technique it is the sole responsibility of the precharge transistor 12 to precharge the bit line A and this would be comparatively slow.

It will be seen that the gates G1, G2, G3 and G4 as well as providing their role of selecting the bit lines to be read or written during memory access operations also serve as part of the charge sharing circuitry by connecting bit lines between which it is desired to share charge during a precharge operation. The state machine logic for controlling whether a particular gate is open or shut is straight forward to those in this field and will not be discussed further. In the example of FIG. 5 all of the gates can be held open during precharge with the gates being controlled in accordance with FIG. 2 during the memory access operations.

Figure 6:
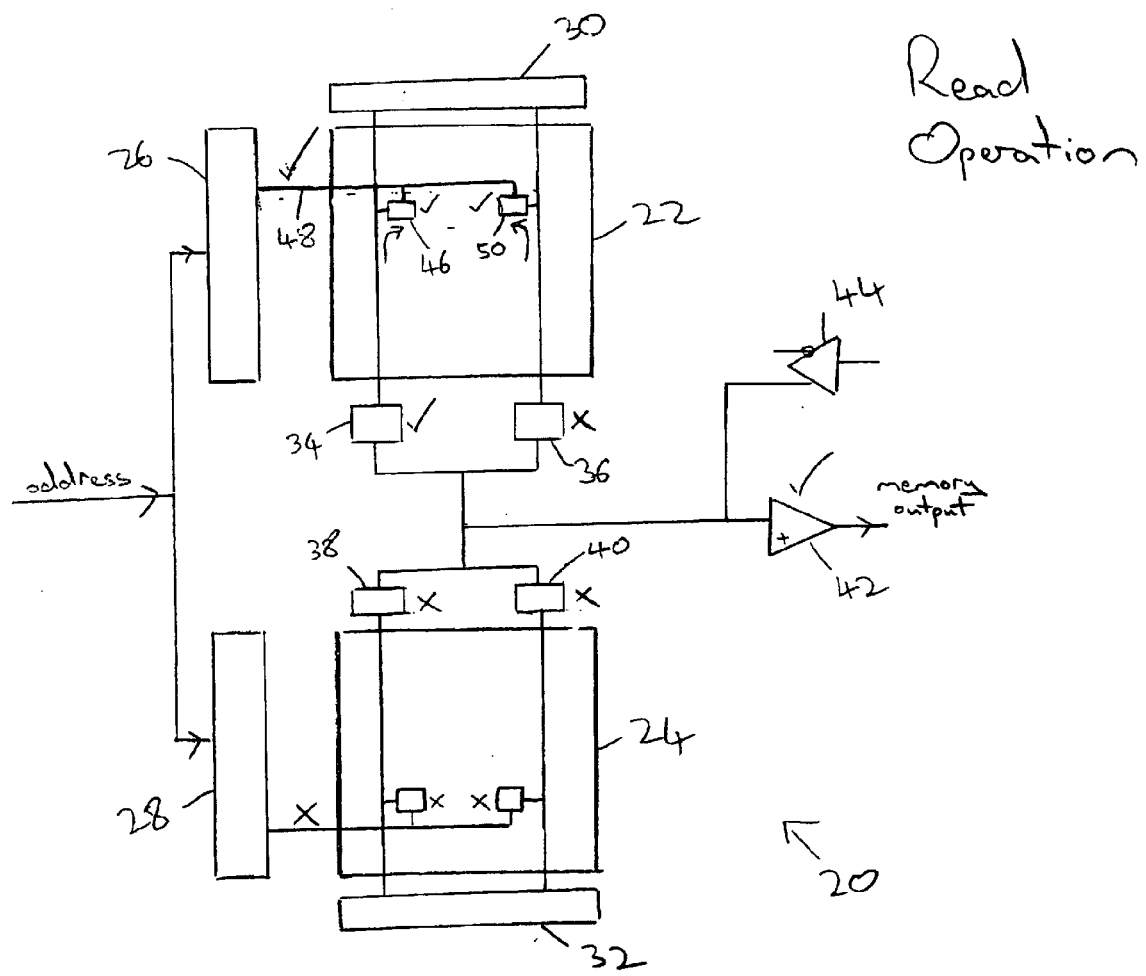
FIG. 6 illustrates an alternative memory circuit having two memory banks and operating during a read operation.

FIG. 6 illustrates a second embodiment. In this embodiment the memory circuit 20 comprises two separate memory banks 22, 24. Each of these memory banks has an associated row decoder 26, 28 and precharge circuit 30, 32. Transmission gates 34, 36, 38 and 40 serve to couple respective bit lines of memory columns to the sense amplifier 42 or the write driver 44. The bit line pairs are in FIG. 6 shown as a single line although it will be appreciated by those in this technical field that this represents two lines carrying complementary signals as in FIG. 1.

FIG. 6 illustrates a read operation. An address is input to the row decoders 26, 28 to specify a memory address to be read. The memory address concerned relates to a memory cell 46 within the memory bank 22 and accordingly the row decoder 26 asserts a row select signal on row select line 48. This row select signal serves to couple all of the memory cells within that memory row to their respective bit lines. Thus, certain bit lines will be selectively discharged according to the data values held in the associated memory cells. In the example shown, only the memory cell 46 is coupled via the gate 34 to the sense amplifier 42 to generate a memory output. Whilst the memory cell 50 is selected by the row select signal and discharges its associated bit line, it is not connected to the sense amplifier 42 since the gate 36 is held shut. It will be appreciated that the relative control of the gates 34 and 36 is achieved by decoding of the address of the memory access so as to select the particular memory cell which is to be read. This control has been omitted from FIG. 6 for the sake of clarity, but will be familiar to those in this technical field. The memory bank 24 illustrated in FIG. 6 does not contain the memory cell 46 which is being read and accordingly no row select signal is asserted. Thus, none of the bit lines within the memory bank 24 are discharged during this read operation. This has the consequence that the charge stored within the bit lines of the memory bank 24 is available for charge sharing during subsequent precharging operations.

Figure 7:
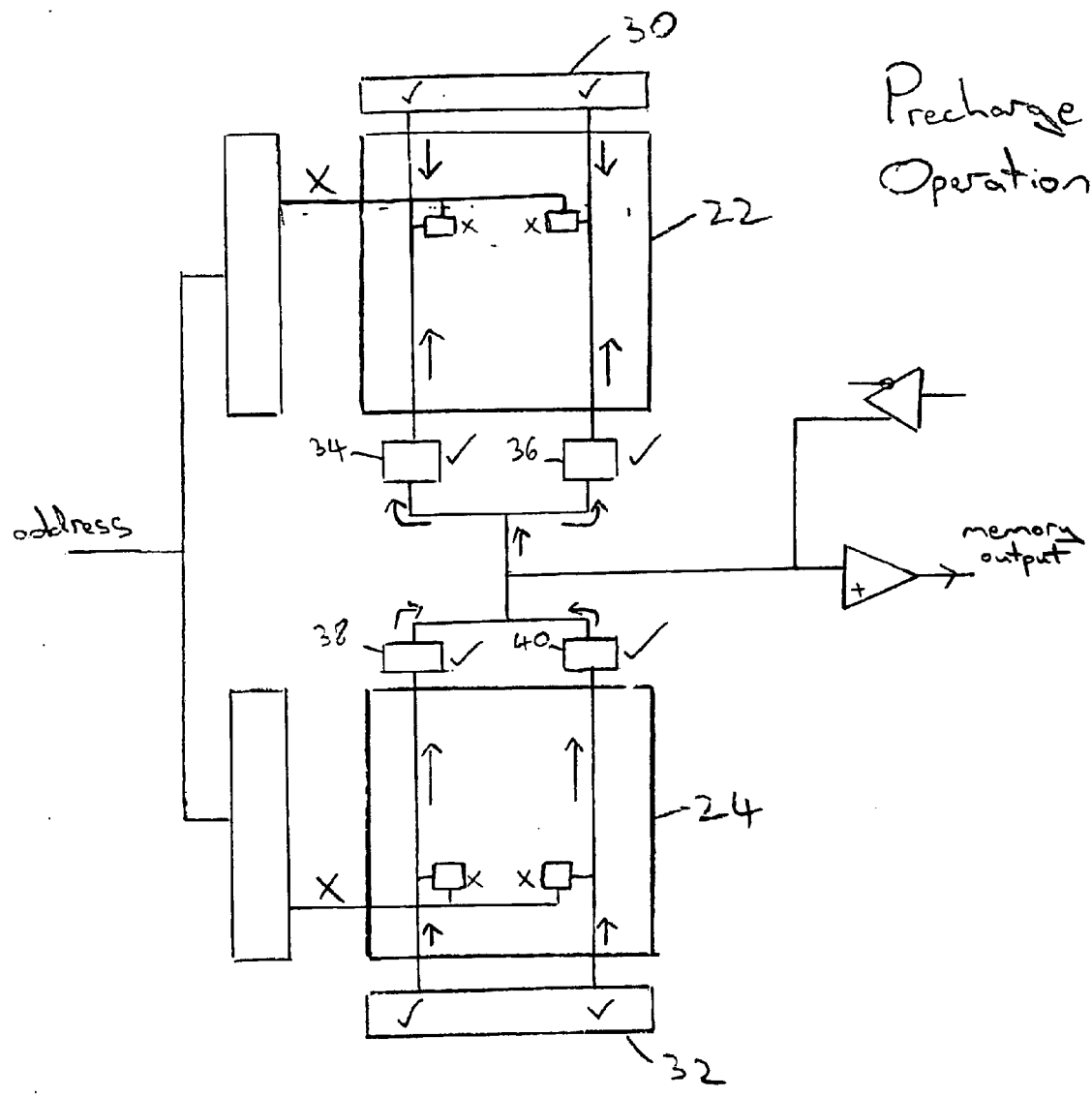
FIG. 7 schematically illustrates the circuit of FIG. 6 during a precharge operation following a read operation.

FIG. 7 schematically illustrates a precharge operation following the read operation of FIG. 6. In this example operation no row select signals are asserted. However, the precharge circuits 30 and 32 associated with both the memory bank 22 and the memory bank 24 are active and serving to impose a high precharge potential upon their associated bit lines. The transmission gates 34, 36, 38 and 40 are all held open such that charge can flow from the bit lines of the memory bank 24 and the precharge circuit 32 across to the bit lines within the memory bank 22. The precharged circuit 30 of the memory bank 22 also serves to force a high potential onto the bit lines of the memory bank 22.

FIG. 7 illustrates an embodiment with two memory banks. It will be appreciated that a different number of memory banks may also be utilized. Generally speaking, the higher the ratio between the number of bit lines that were not accessed within a preceding memory access operation and the bit lines that were accessed, the greater their ability to positively contribute to the precharging operation which follows and so speed that operation. It will be appreciated that a significant factor is that the precharging circuits associated with the contributing bit lines which are sharing their charge are also serving to charge in parallel with their own precharging circuits the bit lines of the memory circuit which have been discharged.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A memory circuit comprising:
    a plurality of memory cells operable to store respective data values;
    a plurality of bit lines coupled to said plurality of memory cells and operable such that when a target memory cell is subject to a memory access operation a target bit line coupled to said target memory cell is driven away from a precharged state;
    a precharge circuit operable to perform a precharge operation to precharge said plurality of bit lines to said precharged state prior to said memory access operation; and
    a charge sharing circuit operable following said memory access to couple bit lines of one or more memory cells not subject to said memory access operation to said target bit line that was driven away from said precharged state to share charge with said target bit line to augment said precharge circuit in returning said target bit line to said precharged state.

2. A memory circuit as claimed in claim 1, wherein said charge sharing circuit comprises one or more switching circuits operable during said memory access operation to selectively couple said target bit line to an output of said memory circuit and operable during said precharge operation to couple said target bit line to said bit lines of one or more memory cells not subject to said memory access operation.

3. A memory circuit as claimed in claim 1, wherein said memory access operation is a write operation and said target bit line is driven away from said precharged state by a write driver circuit so as to force a data value into said target memory cell.

4. A memory circuit as claimed in claim 1, wherein said memory access operation is a read operation and said target bit line is driven away from said precharged state by said target memory cell in dependence upon a data value stored within said target memory cell.

5. A memory circuit as claimed in claim 4, comprising a plurality of memory banks and wherein during a read operation at least one non-accessed memory bank is held static such that bit lines within said non-accessed memory bank are not driven away from said precharge state and said charge sharing circuit is operable following said read operation to share charge between bit lines of said non-accessed memory bank and bit lines within at least one accessed memory bank with bit lines driven away from said precharged state during said read operation.

6. A memory circuit as claimed in claim 1, comprising a plurality of rows of memory cells, each row of memory cells comprising a plurality of memory cells responsive to a shared row select line such that a row select signal upon said row select line couples said plurality of memory cells within said row to respective bit lines.

7. A memory circuit as claimed in claim 6, wherein each bit line is shared by a plurality of memory cells each from a different row of memory cells such that said row select signal serves to couple one memory cell to each bit line.

8. A method of operating a memory circuit, said method comprising the steps of:

storing data values within respective ones of a plurality of memory cells, said plurality of memory cells being coupled to a plurality of bit lines;

when a target memory cell is subject to a memory access operation, driving a target bit line coupled to said target memory cell away from a precharged state;

performing a precharge operation to precharge said plurality of bit lines to said precharged state prior to said memory access operation; and following said memory access, coupling bit lines of one or more memory cells not subject to said memory access operation to said target bit line that was driven away from said precharged state to share charge with said target bit line to assist in said precharge operation returning said target bit line to said precharged state.

9. A method as claimed in claim 8, wherein one or more switching circuits operable during said memory access operation to selectively couple said target bit line to an output of said memory circuit are operable during said precharge operation to couple said target bit line to said bit lines of one or more memory cells not subject to said memory access operation.

10. A method as claimed in claim 8, wherein said memory access operation is a write operation and said target bit line is driven away from said precharged state so as to force a data value into said target memory cell.

11. A method as claimed in claim 8, wherein said memory access operation is a read operation and said target bit line is driven away from said precharged state by said target memory cell in dependence upon a data value stored within said target memory cell.

12. A method as claimed in claim 11, wherein said memory circuit comprises a plurality of memory banks and during a read operation at least one non-accessed memory bank is held static such that bit lines within said non-accessed memory bank are not driven away from said precharge state and following said read operation charge is shared between bit lines of said non-accessed memory bank and bit lines within at least one accessed memory bank with bit lines driven away from said precharged state during said read operation.

13. A method as claimed in claim 8, wherein said memory circuit comprises a plurality of rows of memory cells, each row of memory cells comprising a plurality of memory cells responsive to a shared row select line such that a row select signal upon said row select line couples said plurality of memory cells within said row to respective bit lines.

14. A method as claimed in claim 13, wherein each bit line is shared by a plurality of memory cells each from a different row of memory cells such that said row select signal serves to couple one memory cell to each bit line.

* * * * *